United States Patent [19]

Lee

[11] Patent Number: 5,818,726
[45] Date of Patent: Oct. 6, 1998

[54] SYSTEM AND METHOD FOR DETERMINING ACCEPTABLE LOGIC CELL LOCATIONS AND GENERATING A LEGAL LOCATION STRUCTURE

[75] Inventor: Tsu-Chang Lee, San Jose, Calif.

[73] Assignee: Cadence Design Systems, Inc., San Jose, Calif.

[21] Appl. No.: 611,502

[22] Filed: Mar. 6, 1996

Related U.S. Application Data

[63] Continuation of Ser. No. 228,721, Apr. 18, 1994, abandoned.

[51] Int. Cl.⁶ .................................................. G06F 17/50
[52] U.S. Cl. .......................... 364/489; 364/490; 364/491
[58] Field of Search .......................... 364/578, 468–491; 395/325; 371/22.2; 341/51; 358/133

[56] References Cited

U.S. PATENT DOCUMENTS

| | | | |
|---|---|---|---|
| 3,617,714 | 11/1971 | Kernighan et al. | 364/488 |
| 4,484,292 | 11/1984 | Hong et al. | 364/491 |
| 4,651,284 | 3/1987 | Watanabe et al. | 364/491 |
| 4,686,629 | 8/1987 | Noto et al. | 364/491 |
| 4,775,942 | 10/1988 | Ferreri et al. | 364/490 |
| 4,890,238 | 12/1989 | Klein et al. | 364/491 |
| 4,918,614 | 4/1990 | Modarres et al. | 364/490 |
| 4,979,039 | 12/1990 | Kisor et al. | 358/133 |
| 5,051,917 | 9/1991 | Gould et al. | 364/489 |
| 5,128,871 | 7/1992 | Schmitz | 364/490 |
| 5,222,031 | 6/1993 | Kaida | 364/491 |
| 5,224,056 | 6/1993 | Chene et al. | 364/490 |
| 5,225,991 | 7/1993 | Dougherty | 364/491 |
| 5,231,590 | 7/1993 | Kumar et al. | 364/491 |
| 5,262,959 | 11/1993 | Chkoreff | 364/489 |
| 5,267,176 | 11/1993 | Antreich et al. | 364/491 |
| 5,311,443 | 5/1994 | Crain et al. | 364/491 |
| 5,317,698 | 5/1994 | Chan | 395/325 |
| 5,329,470 | 7/1994 | Sample et al. | 364/578 |
| 5,371,499 | 12/1994 | Graybill | 341/51 |
| 5,420,800 | 5/1995 | Fukui | 364/491 |
| 5,430,734 | 7/1995 | Gilson | 371/22.2 |
| 5,459,673 | 10/1995 | Carmean et al. | 364/489 |
| 5,461,577 | 10/1995 | Shaw et al. | 364/491 |
| 5,513,119 | 4/1996 | Moore et al. | 364/491 |
| 5,592,392 | 1/1997 | Matheson et al. | 364/490 |

OTHER PUBLICATIONS

Burgess et al. ("Paragon: a new package for gate matrix layout synthesis", IEEE Comput. Soc. Press, Proceedings of the European Design Automation Conference, 12 Mar. 1990, pp. 129–134).

*Primary Examiner*—Emanuel Todd Voeltz
*Assistant Examiner*—Phallaka Kik
*Attorney, Agent, or Firm*—Fenwick & West LLP

[57] ABSTRACT

A system and method for testing the placement of logic circuits on a regularly repeated array of integrated devices includes a base array memory, a basis memory, a floor plan memory, an array class memory, a logic cell index memory, a legal location index map memory, a legal location table memory and an engine. The system creates an array class for each type of device that is fabricated on the base array. The engine then tests each location of a basis of each array class for the legality of placing each logic cell of an associated group at that location. The engine then constructs a map of the array class, the legal location index map. Each entry on the map corresponds to a location in the array class, and each entry on the map contains a reference to a bit pattern. The engine also constructs a legal location table. The legal location table is a set of unique bit patterns that indicate the logic cells that may be placed at a location. The entries on the legal location index map reference bit patterns on the legal location table.

37 Claims, 12 Drawing Sheets

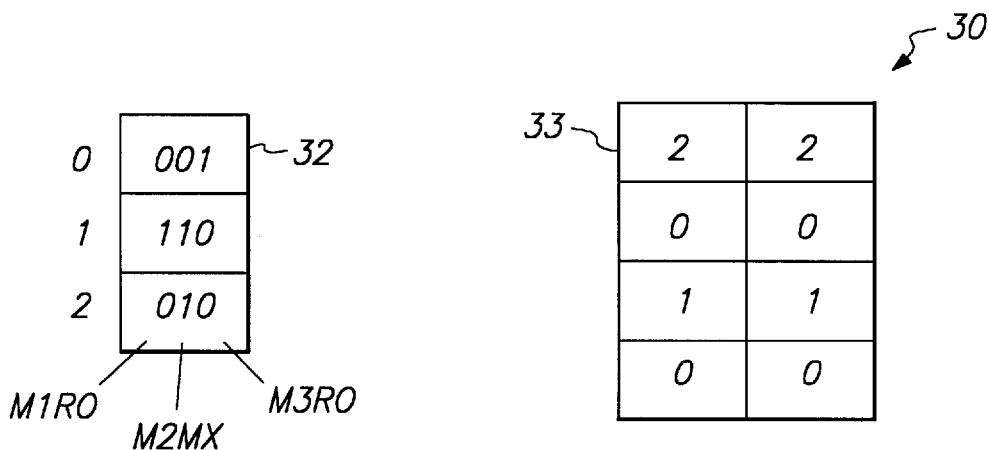
FIG. 4D
FIG. 4E
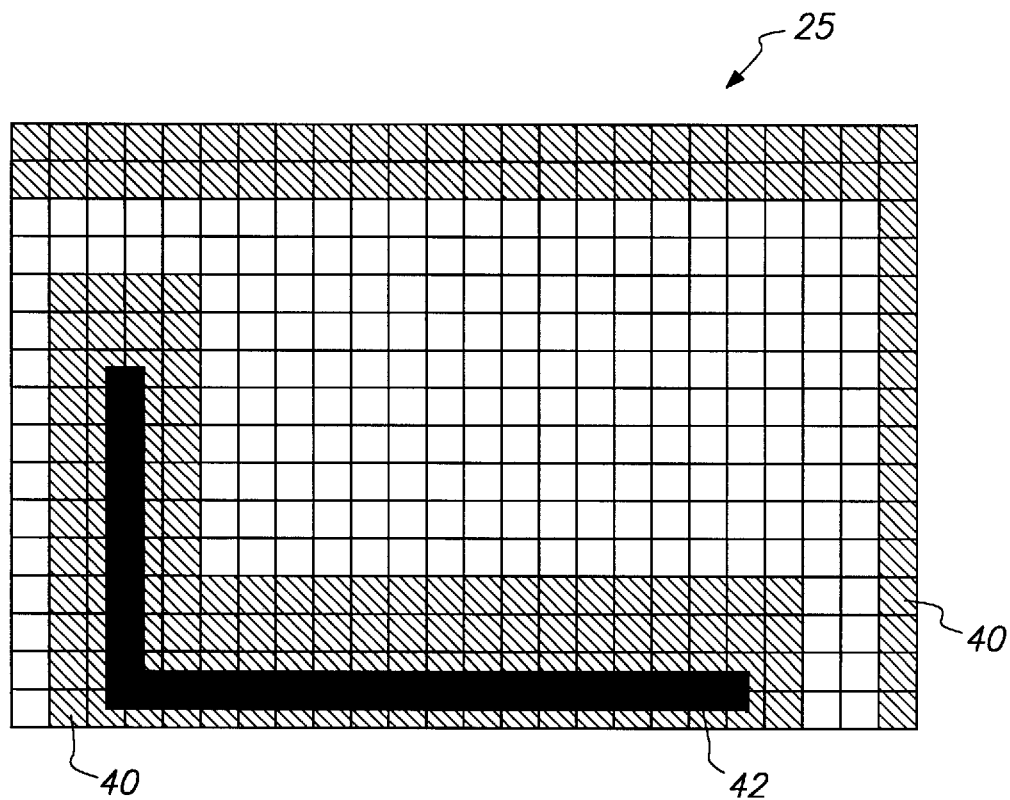
FIG. 5

SYSTEM AND METHOD FOR DETERMINING ACCEPTABLE LOGIC CELL LOCATIONS AND GENERATING A LEGAL LOCATION STRUCTURE

RELATED APPLICATIONS

This is a continuation of application Ser. No. 08/228,721 filed on Apr. 18, 1994 now abandoned.

BACKGROUND OF THE INVENTION

1. Field of the Invention

This invention relates generally to computer aided design systems for gate arrays and in particular to a system and method for determining the locations on a base array where logic cells may be placed.

2. Description of the Related Art

It has become increasingly popular for manufacturers of integrated circuits to purchase a partially fabricated circuit (referred to herein as a "base array") and to customize and complete the base array to form a gate array. This procedure is particularly applicable to mask programmable gate arrays that are made up of large numbers of repeated circuit elements. The manufacturer of a gate array can purchase a base array that has a large number of integrated circuit devices ("devices") already partially fabricated on it. These devices are arranged in a regularly repeated pattern across the base array. The manufacturer of the gate array need only wire the devices together to form logic gates and then wire the logic gates together to form the completed gate array. The gate array manufacturer determines which devices of the base array are used and how to wire the devices together.

One advancement in the area of integrated circuits has been the ability of designers to place logic gates into smaller sized wafer areas. As the wafer area required for each logic gate has decreased, the importance of insuring that logic gates do not interfere with the proper operation of other logic gates or impinge upon the boundaries of the wafer area has increased. For each location on a base array, it must be explicitly determined if each particular logic gate may be placed at that location. If a logic gate may be placed at a location without interfering with the operation of other gates, without interference from the boundaries of the wafer area or otherwise violating design rules, then it is allowable or legal for the logic gate to be placed at that location.

With the decrease in the area of circuits, the number of logic gates that may be placed within a given wafer area has exploded. A typical integrated circuit may now incorporate thousands of logic gates. The acceptability of forming or placing each type of logic gate at each location in the gate array must be determined. Thus, the explosion in the number of gates has made the determination of acceptable or legal locations for a logic gate extremely difficult and time consuming.

In the case of mask programmable gate arrays, the logic gates are created by fabricating logic cells on the pre-fabricated devices. Each logic cell must be tested for possible interference with other logic cells, the edges of the wafer area, and any pre-existing structures. The great number of logic cells and the great number of locations that must be tested require the use of electronic systems to speed the process. The electronic systems that have been developed to determine acceptability, however, suffer from two major problems. First, these systems typically need enormous amounts of memory to handle all the data required in testing whether each type of logic cell may be placed at all possible locations on the base array. The size of the memory necessary for such testing limits the size of the circuit that can be tested, and the cost of such memories is not economical. Furthermore, the time necessary to access data in such an enormous memory greatly slows the testing process. Thus, there is a continuing need for systems and methods that can reduce the memory necessary to implement the testing process.

The second problem with prior art systems is the length of time necessary to complete the testing process. The time necessary to determine acceptability is very long and constitutes one of the major expenses of the design process. The length of time necessary to complete the testing process also limits the number of times a designer may modify a design. Therefore, there is also a continuing need for systems and methods that can decrease the actual time required for the testing process.

SUMMARY OF THE INVENTION

The present invention increases the efficiency of determining the legality of placing logic cells on a base array with a system and method for determining the acceptable locations for the placement of logic cells on a base array. The system of the present invention advantageously includes a display device, a processor, an input device, a memory means, and a data storage device. The memory means further comprises a base array memory, a basis memory, a floor plan memory, an array class memory, a logic cell index memory, a legal location index map memory, a legal location table memory, a figure bin, a master cache memory, a hashing array memory and an engine. The present invention determines whether the placement of a logic cell at a particular location on the base array is acceptable or legal. The system of the present invention uses the processor, the floor plan memory and the logic cell index memory to generate a plurality of array classes. Each array class is a listing of the locations of one particular type of device on the base array. The processor then, under the control of the engine, analyzes each location of the array class to determine if each logic cell associated with that array class may be placed at that location. The engine produces a legal location index map that references data in a legal location index table to indicate the logic cells that may be placed at each location in the array class.

The present invention also comprises a method for determining whether the placement of logic cells is legal for an input floor plan and logic cells. The preferred method comprises the steps of: grouping locations on the floor plan into array classes, manipulating the logic cells for all possible orientations, segregating the resulting logic cells and individually associating the groups of logic cells with the array classes, testing locations of an array class for the legality of placing each logic cell associated with the array class at that location and repeating the testing process for each array class.

The present invention also includes a method for referencing devices on the base array or the floor plan that applies a regular grid reference to devices of irregular size and allows the use of standard x-y coordinates to identify the location of the devices.

BRIEF DESCRIPTION OF THE DRAWINGS

FIGS. 3A, 3B and 3C are block diagrams of an exemplary base array, an exemplary floor plan for the base array and an exemplary array class of the floor plan, respectively;

FIG. 4A is a block diagram of a plurality of exemplary logic cells;

FIG. 4D is a block diagram showing an exemplary legal location table;

FIG. 4E is a block diagram showing an exemplary legal location index map;

FIG. 5 is a diagram of an exemplary base array showing the regions that the present invention tests for the legality of placing a logic cell;

DESCRIPTION OF THE PREFERRED EMBODIMENT

Figure 1:
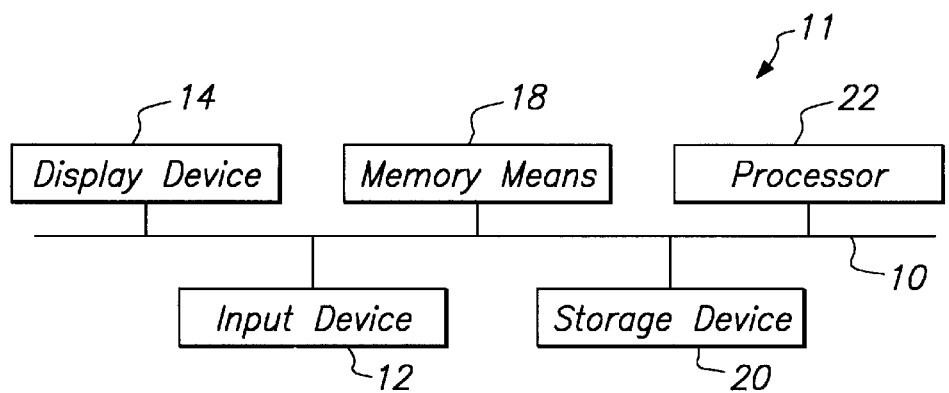
FIG. 1 is a block diagram of a preferred embodiment of a system of the present invention for testing the placement of logic cells on a base array.

Referring now to FIG. 1, a block diagram of the preferred embodiment of a system 11 for determining allowable locations for logic cells on a base array is shown. The system 11 preferably comprises an input device 12, a display device 14, a memory means 18, a storage device 20 and a processor 22. The input device 12, the display device 14, the memory means 18, the storage device 20, and the processor 22 are coupled together by a bus 10 in a von Neuman architecture. Those skilled in the art will realize that these components 10, 12, 14, 18, 20 and 22 may be coupled together according to other computer architectures without departing from the spirit or scope of the present invention.

The preferred embodiment of the input device 12 is a keyboard and mouse type controller. The input device 12 is a means for inputting data and commands from a user to the system 11.

The display device 14 is preferably a computer monitor for conveying to the user information regarding the functioning of the system 11 and for outputting data. The outputs of the system 11 are displayed on the display device 14.

The storage device 20 is preferably a hard disk drive. The storage device 20 is a means by which the system 11 stores operating systems, program instruction steps and data. The storage device 20 may also be used as a means of inputting data to the system 11.

The processor 22 executes program instruction steps, generates commands and analyzes data configurations that are stored in the memory means 18 and in the storage device 20. The processor 22 is preferably a microprocessor such as the Intel 80486 from Intel Corporation of Sunnyvale, Calif.

Figure 2:
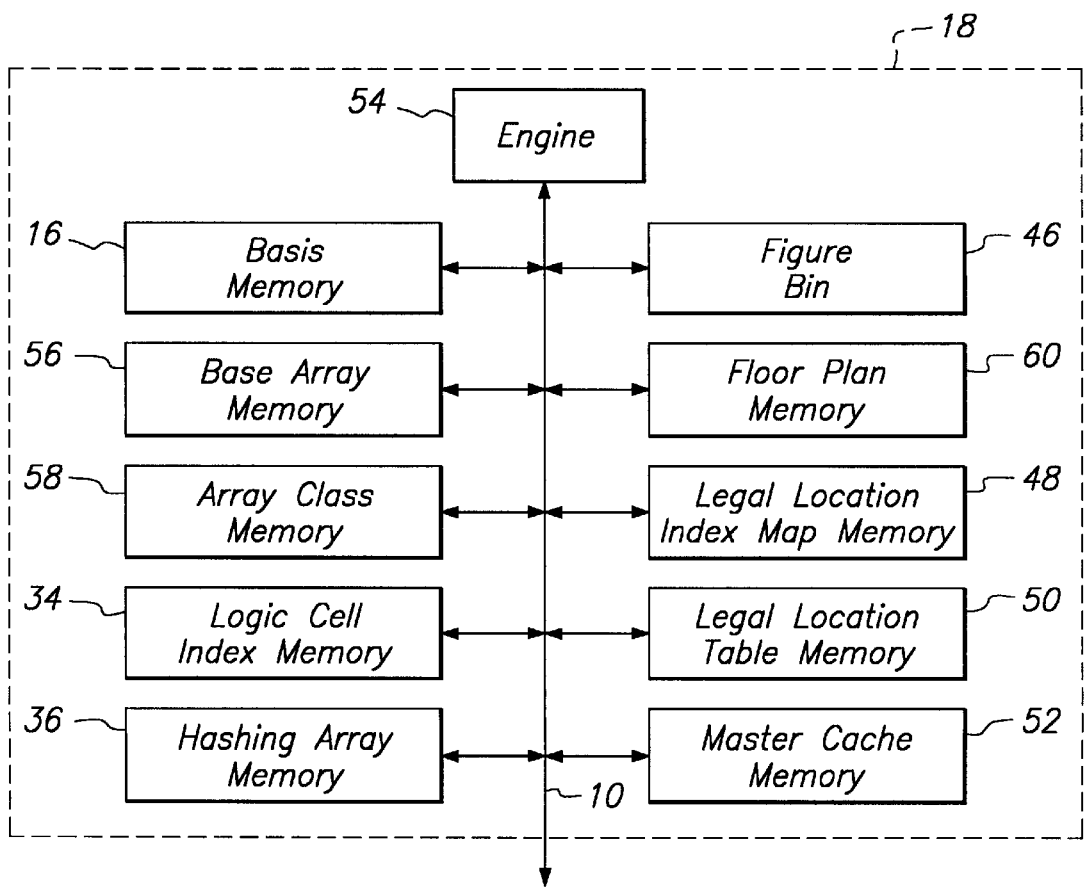
FIG. 2 is a block diagram of the preferred embodiment of the memory means constructed according to the present invention.

Referring now to FIG. 2, a block diagram of the memory means 18 is shown. The memory means 18 is preferably a dynamic, random access memory that stores data, operating systems and program instruction steps. The memory means 18 further comprises a base array memory 56, a basis memory 16, a floor plan memory 60, an array class memory 58, a logic cell index memory 34, a master cache memory 52, an engine 54, a legal location table memory 50, a legal location index map memory 48, a hashing array memory 36 and a figure bin 46. Those skilled in the art will realize that the base array memory 56, the basis memory 16, the floor plan memory 60, the array class memory 58, the logic cell index memory 34, the master cache memory 52, the engine 54, the legal location table memory 50, the legal location index map memory 48, the hashing array memory 36 and the figure bin 46 may be contiguous blocks of memory even though they will now be discussed as separate memories or registers.

Figures 3A, 3B:
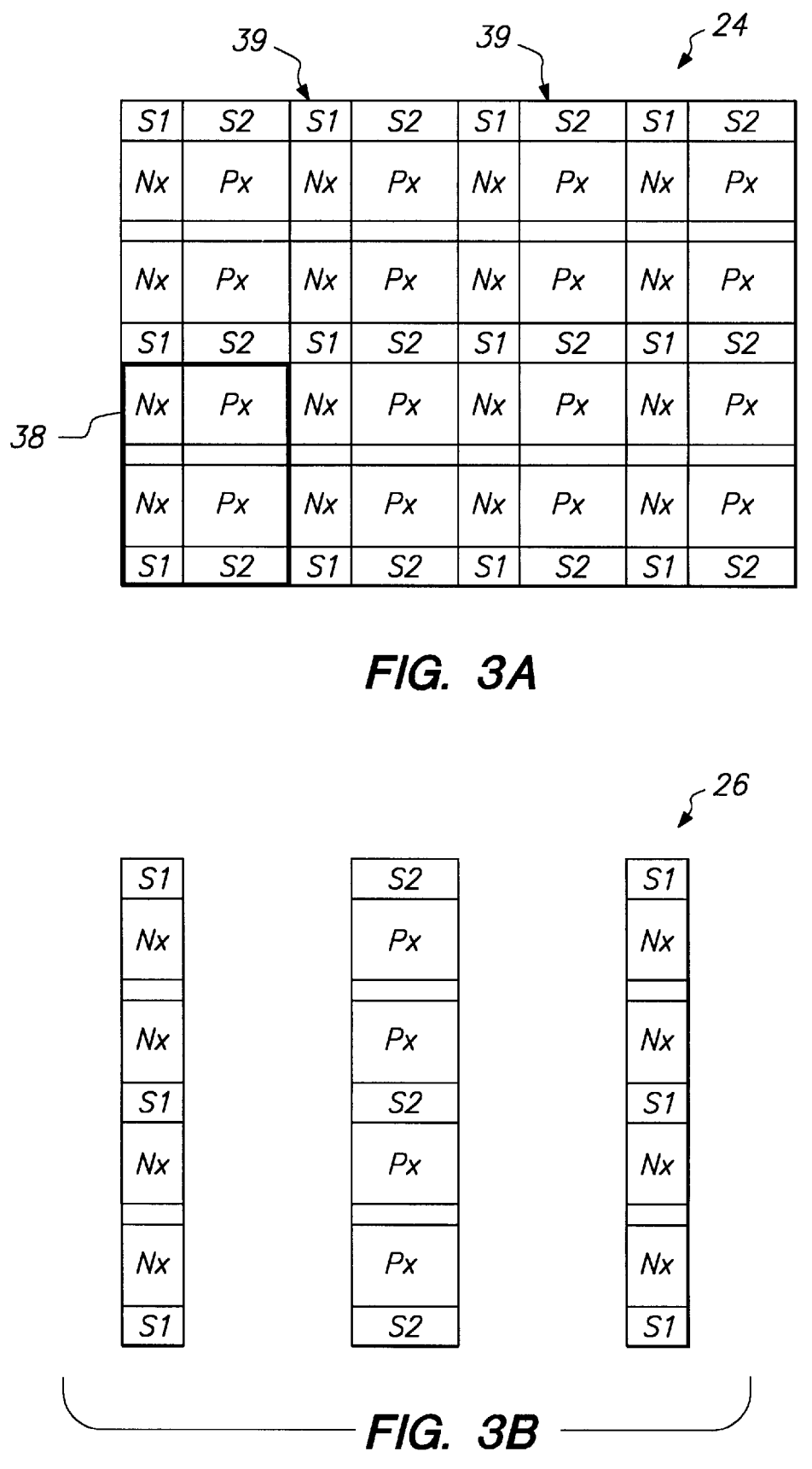

Referring also now to FIG. 3A, a block diagram of a portion of an exemplary base array 24 and an exemplary basis 38 are shown. The base array specifies the bounds of each location on the array and the type of device that has been pre-fabricated at each location. The exemplary base array 24 contains 4 different types of devices arranged in a regularly repeated pattern across the base array 24. The four types of devices are referred to as $N_x$, $P_x$, $S_1$, and $S_2$. These devices may be an N-channel MOSFET, a P-channel MOSFET, and other such devices. The base array 24 also contains a plurality of blank regions. These blank regions do not contain any devices and are unlabeled in FIG. 3A. Those skilled in the art will realize that the devices on a base array may be any one of a variety of integrated circuit devices including bi-polar junction transistors, CMOS transistors, and p-n junction diodes. Each device occupies a unique location on the base array. The system 11 preferably references the base array and the data structures that are derived from the base array from the lower, left hand corner of the base array.

An exemplary basis 38 is also shown in FIG. 3A. A basis is the smallest pattern of devices that is repeated across the base array. The basis also has its reference origin in the lower, left hand corner of the base array and is repeated across the base array. Only one basis 38 is identified in FIG. 3A. Wires interconnecting the devices may be laid horizontally over the blank regions. The layout of the base array and basis are inputs to the system 11 that are provided by the manufacturer of the base array. The basis also contains a record of all logic cells that are already placed on the basis. Often, logic cells will be regularly placed across the base array before other logic cells are placed on the base array. These pre-placed logic cells are included within the basis. The system 11 preferably stores a record of the base array in the base array memory 56 and a record of the basis in the basis memory 16. The base array memory 56 and the basis memory 16 are coupled to each other and the processor 22 by the bus 10.

Referring also now to FIG. 3B, a block diagram of an exemplary floor plan 26 for a portion of the exemplary base array 24 is shown. A floor plan is the set of locations on the base array where the lower left hand corner of a logic cell may be placed. In order to provide room for vertically interconnecting wires and other uses, some of the devices of the base array are not usable. Certain columns of the base array are allocated or designated as unusable through the definition of the floor plan. For example for the base array 24 of FIG. 3A, the floor plan 26 of FIG. 3B specifies that vertical interconnecting structures will be laid over the third and sixth columns 39 of devices of the base array 24, and therefore, these devices are not usable for forming logic cells. The floor plan accounts for the loss of these columns and identifies valid locations where logic cells may be placed by specifying valid possible locations for the lower left hand corner device of the logic cells. There are other devices of the base array that are not shown on the floor plan, but will be used to implement the logic cells. These devices, however, may not be used for the lower left hand corner device of a logic cell, and therefore, are not shown on the floor plan. The floor plan is an input to the system 11 and is preferably stored in the floor plan memory 60. The floor plan memory 60 is coupled to the processor 22, the base array memory 56 and the basis memory 16 through the bus 10.

Figures 3C, 4A:
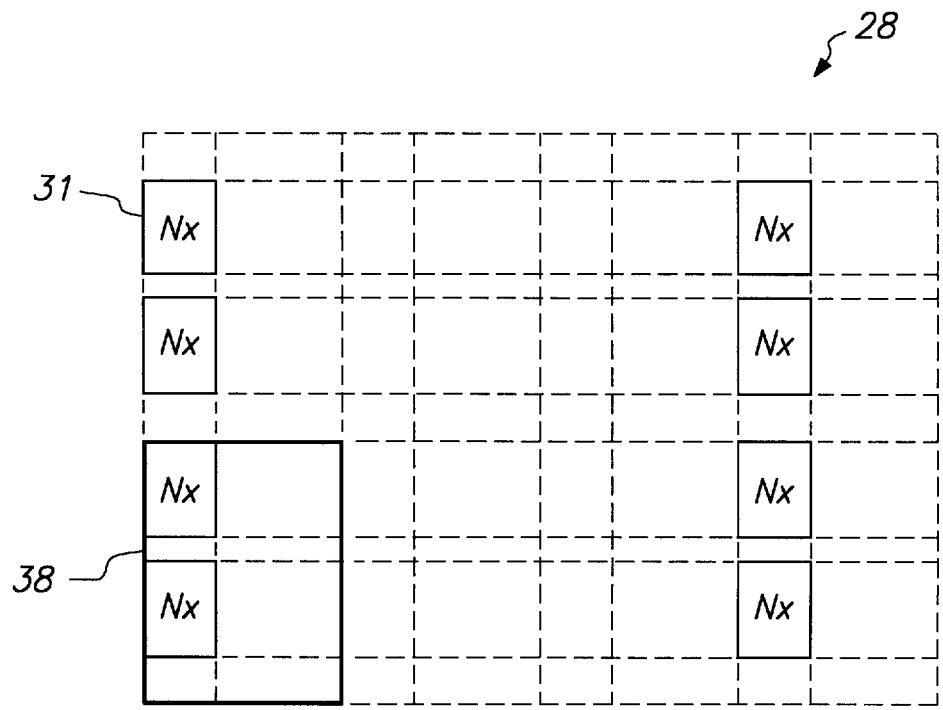

Referring also now to FIG. 3C, a block diagram of a portion of an exemplary array class $N_x$ 28 corresponding to the exemplary floor plan 26 is shown. An array class is a collection of locations on the floor plan having the same type of device. The processor 22 searches the floor plan memory 60 for the locations having the same type of device. The present invention also increases the searching speed using a hashing array as is described below with reference to FIGS. 10A, 10B and 11. The processor 22 begins searching the floor plan memory 60 at a position that corresponds to the lower left hand corner of the base array and identifies the locations on the floor plan of the particular type of device. These locations are grouped together to form an array class. FIG. 3C shows a portion of the array class $N_x$ 28 for device $N_x$. The processor 22 generates an array class for each type of device that is fabricated on the base array and stores a description (i.e., a group of locations) of each array class in the array class memory 58. In the exemplary embodiment, four array classes would be created in accordance with the present invention: an array class $N_x$ 28 for device type $N_x$, and array class for device type $P_x$, an array class for device type $S_1$, and an array class for device type $S_2$. The array class memory 58 also stores a set of program instruction steps that, when executed by the processor 22, generate the array classes. The array class memory 58 is coupled to the floor plan memory 60, the basis memory 16 and the processor 22 through the bus 10. Also shown in FIG. 3C is the basis 38.

Figure 4B:
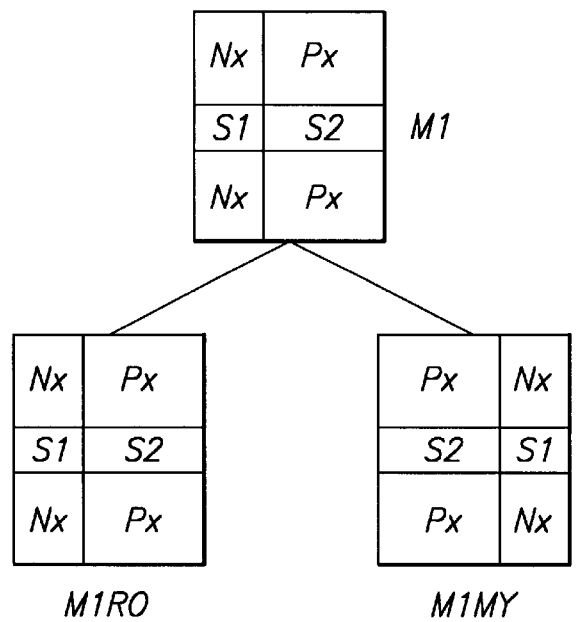
FIG. 4B is a block diagram showing the results of the transposition of one of the exemplary logic cells.
Figure 4C:
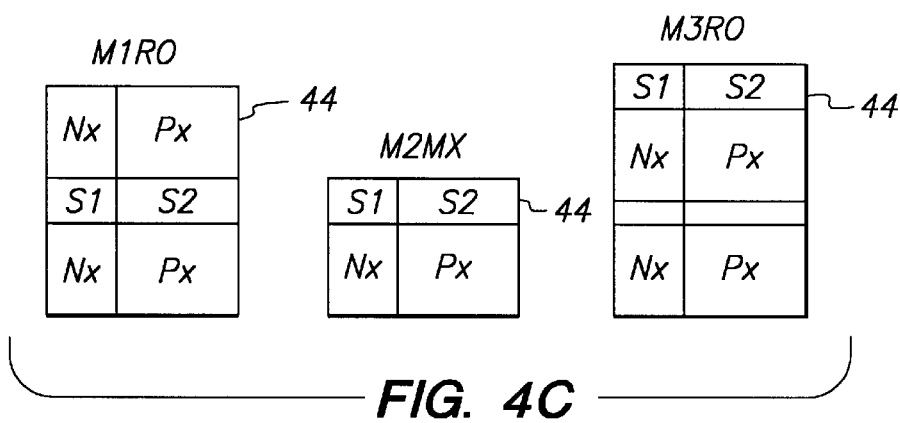
FIG. 4C is a block diagram showing a plurality of master caches associated with array class $N_x$.

A logic cell index is a description of the logic cells that will be fabricated on the base array. The logic cell index is a complete description of what devices form the logic cells and of how the devices will be interconnected to form logic cells. The logic cell index is an input to the system 11 and is preferably stored in the logic cell index memory 34. The logic cell index memory 34 is coupled to the bus 10. Referring also now to FIG. 4A, block diagrams of three exemplary logic cells M1, M2 and M3 are shown. For ease of understanding, the interior wiring of the logic cells M1, M2 and M3 is not shown in FIG. 4A. A description of the logic cells M1, M2 and M3 would preferably be stored in the logic cell index memory 34. The logic cell index memory 34 also stores a list of logic cells that cannot be fabricated on the base array 24. Certain physical orientations of the logic cells cannot be fabricated on the base array 24 because of the arrangement of the devices on the base array. Descriptions of these logic cells are stored in the logic cell index memory 34. This list of logic cells, which cannot be fabricated, need not be exhaustive of all logic cells that cannot be fabricated. Referring also now to FIG. 4B, a block diagram of the result (M1Y1) of the processor 22 transposing logic cell M1 about the y-axis is shown. The processor 22 rotates each logic cell 90, 180, and 270 degrees from the original orientation of the logic cell and about the center of the logic cell. The processor 22 also transposes each logic cell through the x-axis and through the y-axis. Finally, the processor 22 rotates the logic cells that result from transposing the original logic cells through the x-axis and through the y-axis 90 degrees. Thus each logic cell results in 8 orientations of the logic cells. By such manipulations, the processor 22 generates the possible geometric orientations for forming each logic cell on the base array 24. The processor 22 temporarily stores the logic cells that result from the manipulations in the memory means 18. Manipulating logic cell M1 yields two unique orientations of the devices that can be fabricated on the base array 24. Certain orientations of the logic cells cannot be fabricated on the base array. An orientation of logic cell M1 where device $S_1$ is above or below device $S_2$ cannot be fabricated on base array 24 as can be seen by comparing this configuration to FIG. 3A. Preferably, the processor 22 compares the logic cells that resulted from the manipulation of the logic cells described in the logic cell index to the logic cells that cannot be fabricated that are listed in the logic cell index memory 34. The processor 22 eliminates any resulting logic cell that matches a logic cell that cannot be fabricated. Once the processor 22 has generated the possible geometric orientations of the logic cells, it groups the resulting logic cells, which are temporarily stored in the memory means 18, along with the original orientations of the logic cells according to the device in the lower left hand corner of each logic cell. Within these groupings, the processor 22 combines logic cells that are of identical shape and size. When combining logic cells, the processor 22 combines the interior wiring of the logic cells using a logical OR function. Thus, the interior wiring of the resulting logic cell is the combination of the interior wiring of the logic cells that were combined. When the process of combining logic cells is complete, the remaining logic cells are master caches. Referring also now to FIG. 4C, a block diagram of a group of the exemplary master caches 44 that are associated with the array class $N_x$ 28 are shown. These master caches 44 were derived from the exemplary logic cells M1, M2 and M3. The exemplary master caches 44 shown are master caches M1RO, M2MX and M3RO. M1RO is logic cell M1 in its normal orientation. M2MX is logic cell M2 transposed about the x-axis. M3RO is logic cell M3 in its normal orientation. The other manipulations did not result in logic cells that can be fabricated on base array 24 or that are unique. Each group of master caches is associated with a corresponding array class. The corresponding array class is the array class that contains the locations on the floor plan of devices that are in the lower left hand corner of each master cache of the group. The processor 22 stores a description of each master cache in the master cache memory 52. The master cache memory 52 also holds program instruction steps that, when executed by the processor 22, manipulate the logic cells, eliminates duplicate logic cells and logic cells that cannot be fabricated, combines the logic cells into master caches, groups the master caches and associates the groups of master caches with the corresponding array class. The master cache memory 52 is coupled to the processor 22, the array class memory 58 and the logic cell index memory 34 through the bus 10.

The engine 54 is a set of program instruction steps that are stored in the memory means 18. These program instruction steps, when executed by the processor 22, construct the legal location tables and the legal location index maps. The engine 54 is coupled to the processor 22, to the master cache memory 52, to the array class memory 58, to the basis memory 16, to the legal location index map memory 48 and to the legal location table memory 50 through the bus 10. The operation of the engine, and the method by which the engine 54 constructs the legal location index maps and the legal location tables is discussed below with reference to FIG. 9.

A legal location table is a set of bit patterns that indicate the master caches that may be placed at the location in an array class. Each bit pattern contains a bit for each master cache of the group of master caches associated with the array class. The bit is set high if the master cache may be legally placed at the location or is set low if the master cache may not be legally placed at the location. The engine 54 eliminates duplicate bit patterns and ultimately stores only unique bit patterns. Thus, locations at which the same set of master caches may be placed share a bit pattern. By sharing bit patterns, the system 11 advantageously reduces the memory necessary to store the legal locations and their associated logic cells. The present invention preferably provides a legal location table for each array class. Referring also now to FIG. 4D, a block diagram of an exemplary legal location table 32 is shown. The legal location table 32 is associated with array class $N_x$ 28. The legal location table 32 provides a column of bits for each master cache of the array class $N_x$ 28. In the current example, the first column identifies the legal locations where M1RO may be placed. Similarly, the second and third columns respectively correspond to locations where master cache M2MX and M3RO may be placed. If legal placement of master caches for a location is specified by bit pattern 0 of the table of FIG. 4D, the master cache M3RO can be legally placed at the location and master caches M1RO and M2MX cannot be placed legally. The legal location table 32 would contain a separate bit pattern for each location in the array class $N_x$ 28 if there was no duplicate bit pattern elimination. Thus, in the exemplary case, the system 11 has reduced the number of bit patterns that must be stored from 8 to 3. In an actual case, with thousands of logic cells and hundred of thousands of locations, the savings from eliminating duplicate bit patterns are substantial. Thus, present invention provides a system 11 that greatly reduces the amount of memory required to identify the logic cells that may be placed or formed at a particular location on the base array. The system 11 stores the legal location tables in the legal location table memory 50. The legal location table memory 50 is coupled to the array class memory 58 and to the engine 54 through the bus 10.

A legal location index map is a map of the locations in an array class. The map indicates for each location of the array class a bit pattern in the corresponding legal location table that specifies the master caches that may be legally placed at that location. Each location in the legal location index map corresponds to a location in the corresponding array class. The correspondence between a legal location index map and an array class can be seen by comparing locations in array class $N_x$ 28 as shown in FIG. 3C with the corresponding locations of the legal location index map 30 shown in FIG. 4E. The location 33 in the upper left hand corner of the legal location index map 30 corresponds to the upper left hand corner portion 31 in the array class $N_x$ 28. Every other entry on the legal location index map 30 corresponds with a location, in the same relative position, in the array class $N_x$ 28. Preferably, there is a legal location index map for each array class. Each location in the legal location index map contains a reference to a bit pattern in the legal location table for the same array class. The referenced bit pattern of the legal location table indicates the master caches that may be placed at that location. Thus, for the lowest, left most location in the array class $N_x$ 28, the legal location index map 30 indicates that bit pattern number 0 in the legal location table 32 describes the master caches 44 that may be placed there. Bit pattern number 0 on the legal location table 30 indicates that master cache M3RO may be placed at this location. The system 11 preferably stores the legal location index maps in the legal location index map memory 48. The legal location index map memory 48 is coupled to the processor 22, the legal location table memory 50 and the engine 54 through the bus 10.

The hashing array is an grid reference used for converting the irregularly sized devices into regular spacing so that an x-y axes plane may be used to locate the locations on the base array, on the floor plan, and on the array classes. To ease the conversion process and reduce the time for searching, each step of the hashing array is preferably divided into gradients, the number of which is set to be a power of two. Use of the hashing array greatly speeds up the testing process. The hashing array allows the system 11 to quickly find locations on the base array when the system 11 must test specific locations. By setting the number of gradients of a step of the hashing array to be a power of two, the system 11 advantageously uses a shift function to accomplish the hashing step. The shift function is much faster than multiplication or division that may also be used to accomplish the hashing step. The processor 22 stores a record of the hashing array in the hashing array memory 36. The hashing array memory 36 is coupled to the base array memory 56, the basis memory 16, the array class memory 58, the floor plan memory 60, the legal location index map memory 48, the engine 54 and to the processor 22 through the bus 10.

The figure bin 46 is a means for storing a record of the pre-existing structures on the base array. The figure bin 46 also includes a record of the shapes of the pre-existing structures and their locations on the base array. The pre-existing structures, such as pre-wires and pads, are structures on the base array when it is purchased from the base array manufacturer. Pre-existing structures may not be moved or otherwise modified. Logic cells may not be placed over pre-existing structures because of interference problems. The processor 22 tests the figure bin 46 for pre-existing structures before concluding the testing process. The figure bin 46 is coupled to the processor 22, the base array memory 56 and the array class memory 58.

Figure 6:
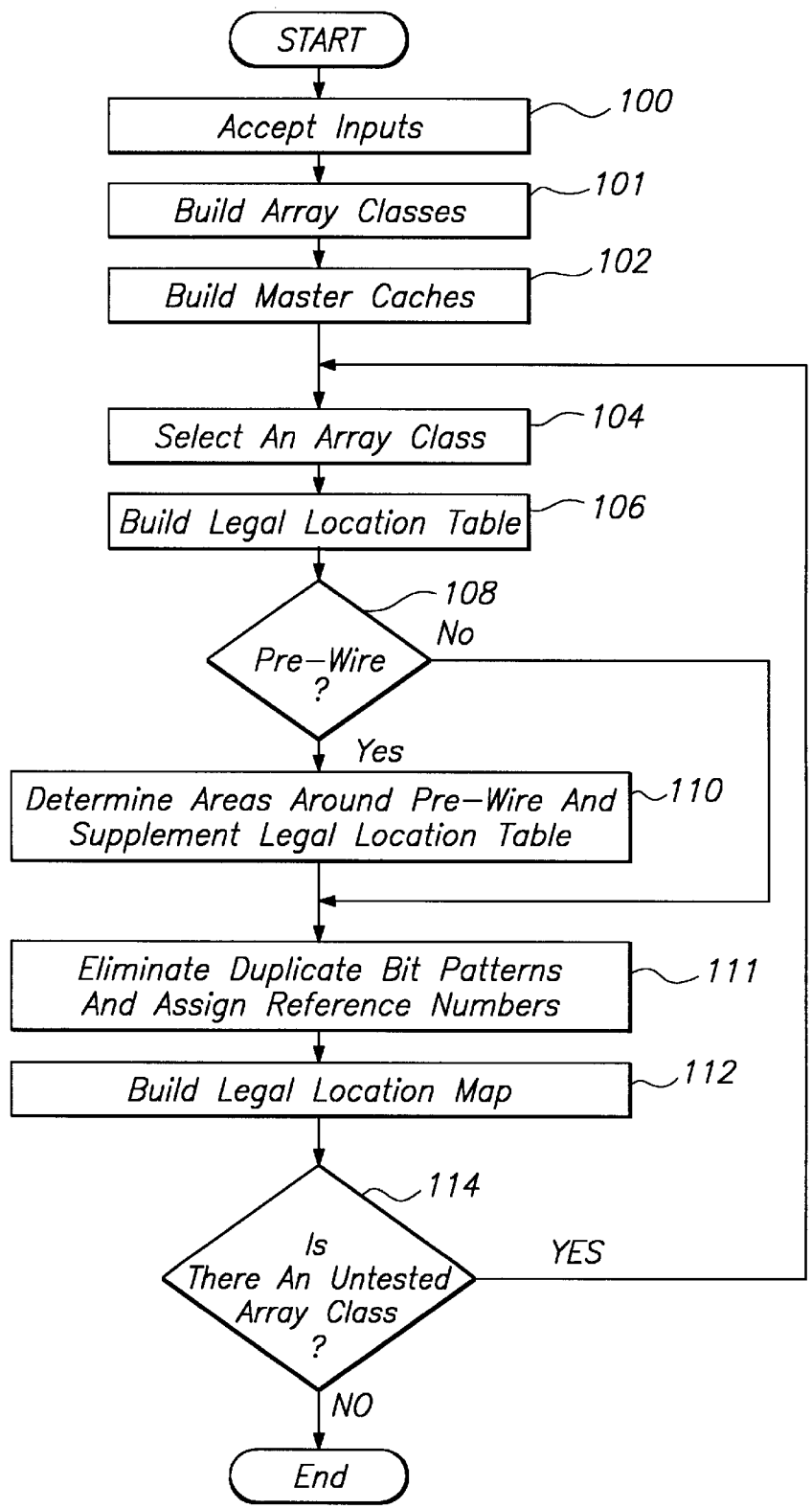
FIG. 6 is a flowchart showing the preferred method for testing the placement of logic circuits according to the present invention.

Referring now to FIG. 6, the preferred method for testing the placement of logic cells on a base array is shown. Within this description of the preferred method, whenever the engine 54 takes an action, it is the processor 22, under control of the program instruction steps that are stored in the memory means 18, that is actually executing such action. Beginning in step 100, the system 11 accepts as inputs a base array, a floor plan, descriptions of any pre-existing structures and a logic cell index. The system 11 preferably stores these objects in the base array memory 56, the floor plan memory 60, the figure bin 46 and the logic cell index memory 34, respectively. In step 101, the processor 22, under control of the program instruction steps stored in the array class memory 58, sorts the locations of the floor plan by device and generates a plurality of array classes. The method by which the system 11 creates the array classes is discussed in detail in connection with FIG. 7 below. The processor 22 then, in step 102, creates the master caches. The method by which the system 11 creates the master caches is described with reference to FIG. 8 below.

In step 104, the engine 54 selects an untested array class and its associated group of master caches. The engine 54 then, in step 106, builds the legal location table for that array class. The engine 54 tests the locations of the array class that are within one basis, or the locations of the array class that are within the minimum number of bases necessary to accommodate the largest master cache. The engine 54 also tests locations of the array class that lie within a predetermined distance of the upper and right hand boundaries of the base array. The method by which the system 11 constructs the legal location table is described in detail below in connection with FIG. 9. After the first pass at constructing the legal location table, the processor 22 in step 108 tests the figure bin 46 to determine if there are any pre-wires or other pre-existing structures on the base array. If there are such pre-existing structures, the processor 22 proceeds to step 110 where the engine 54 determines the areas around the pre-existing structure that must be tested, test the locations within a predetermined distance of the pre-existing structures and supplements the legal location table with the new bit patterns created by testing. The method by which the engine 54 determines the area around a pre-existing structure that must be tested is the same method the engine 54 uses to determine the area along boundaries of the base array that must be tested and is described below with reference to FIG. 9. When the engine 54 has completed the legal location table in step 110, or if there were no pre-existing structures in step 108, the method proceeds to step 111. At step 111, the engine 54 eliminates all duplicate bit patterns from the legal location table. The legal location table is now a listing of unique bit patterns. The engine 54 also assigns to each unique bit pattern a unique reference number in step 111.

Next in step 112, the engine 54 then constructs a legal location index map for the array class by assigning to each location in the legal location index map a reference number corresponding to the bit pattern in the legal location table that describes the master caches that may be placed at that location. The engine 54 first assigns reference numbers for the locations in a basis as determined in the testing step. Then the reference numbers are effectively repeated across the legal location index map for each location in the array class according to each location's relative position in its respective basis. For example, the two locations on the bottom row of the legal location map 30 shown in FIG. 4E are assigned the same bit pattern reference number, 0, because they each are at the same relative position in their respective bases. Thus, the present invention greatly reduces the number of locations that are tested for each array class. The engine 54 preferably repeats the legal locations starting from the lower, left hand corner of the array class, moving upwards and to the right. In particular, the legal location map 30 shown in FIG. 4E would have a first row of locations with reference number 1, a second row of locations with reference number 0, a third row of locations with reference number 1 and a forth row of locations with reference number 0 after the bit patterns of the basis are repeated across the legal location map 30. Next, the legal location map is modified to take into account locations in the array class that lie within a predetermined distance of the boundaries of the base array. Since these locations are within the predetermined distance of the boundaries of the base array, the master caches that may be placed at these locations, and thus, the bit patterns for these locations may be different that produced by repeating the basis over the array class. The engine 54 replaces the entries of the legal location map for locations that lie along the upper boundary and the right hand boundary of the base array. In step 106, the engine 54 identified a set of locations of the array class that are within a region along the boundary of the base array. The engine 54 specifically tested these locations. The engine 54 now replaces the reference numbers, which were originally assigned to these locations by the repetition of the reference numbers for the basis, with a reference number to the bit patterns that were specifically constructed, in step 106, for each of these locations. For example, the top row of locations in the legal location map 30 of FIG. 4E have reference number 1 replaced with reference number 2. Because these locations are positioned near the top edge of the base array 24, only master cache M2MX can be placed at the location on the base array corresponding to the top row of the map 30. Thus, the reference number is change from reference number 1 that specifies that M1RO and M2MX may be legally placed at that location to reference number 2 that specifies that M2MX may be legally placed at that location. Similarly, in step 110, the engine 54 identified a group of locations that lie over pre-existing structures and in the region surrounding any pre-existing structures. The engine 54 replaces the references to the bit patterns, which were originally assigned to these locations by the repetition of the reference number for a basis, with a reference to the bit patterns that were specifically constructed, in step 110, for each of these locations. The legal location index map for this array class is now complete.

The processor 22 then determines, in step 114, if there are any untested array classes. If there are untested array classes, the method returns to step 104 to repeat the testing process for an untested array class. If in step 114 there are no untested array classes, the testing process is complete, and the method ends.

Figure 7:
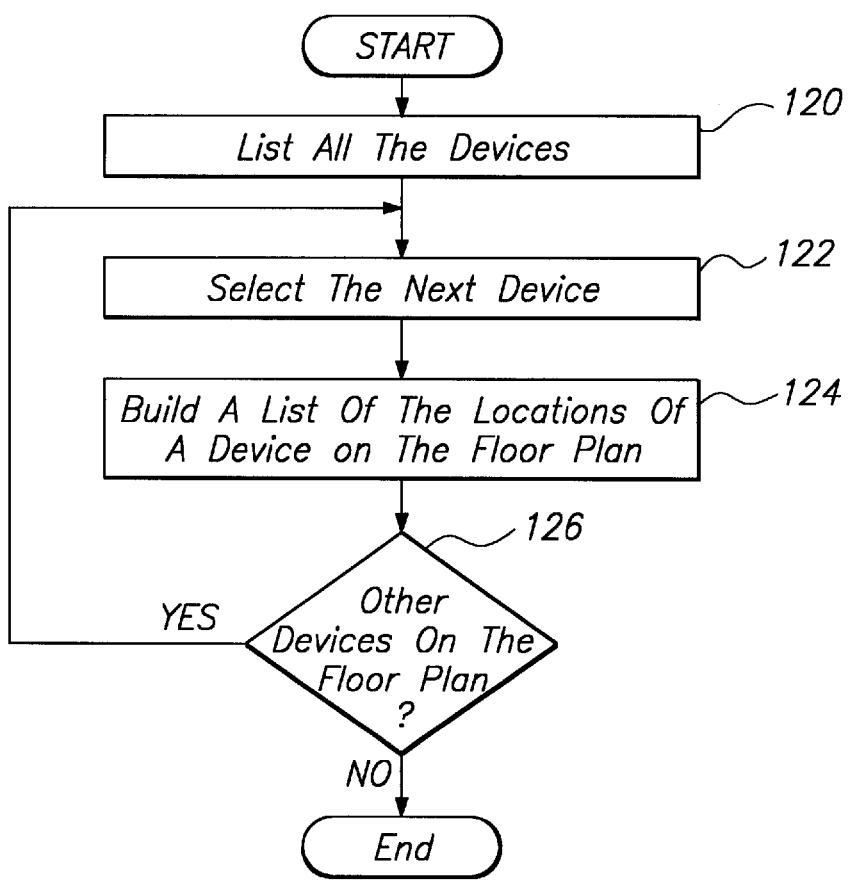
FIG. 7 is a flowchart showing the preferred method for generating array classes.

Referring now to FIG. 7, the method by which the system 11 constructs the plurality of array classes is shown. Beginning in step 120, the processor 22 lists all device types that are fabricated on the base array. The processor 22 then selects the next device type in step 122. The processor 22 lists, in step 124, all the locations on the floor plan at which the device of the selected type is located. This listing is an array class. The processor 22 then, in step 126, determines if there are other devices on the floor plan for which an array class has not yet been constructed. If there are such devices, the processor 22 returns to step 122. Once an array class for all types of devices on the base array has been constructed, the method ends.

Figure 8:
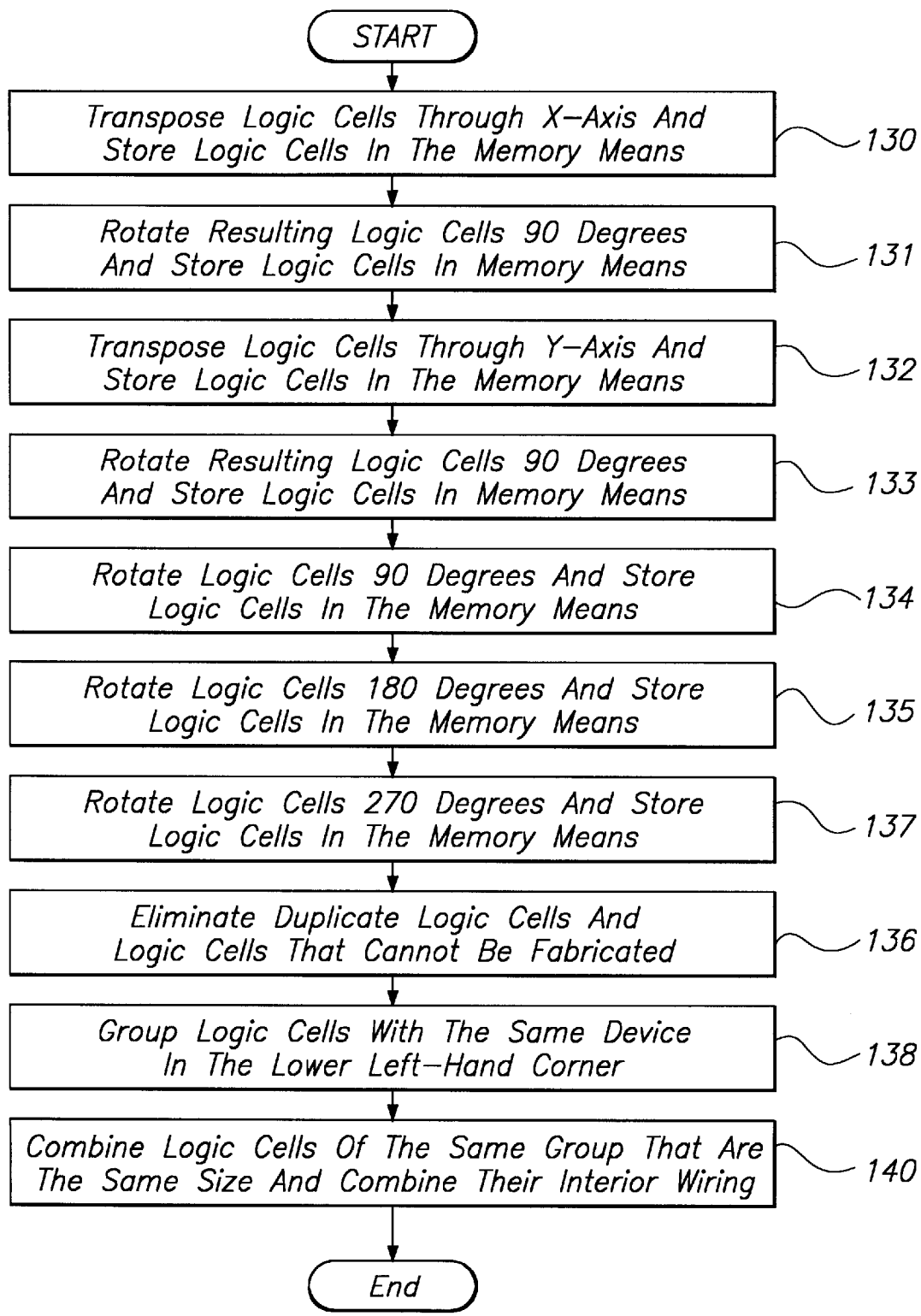
FIG. 8 is a flow chart showing the preferred method for transposing logic cells to generate all geometric orientations of the logic cells.

Referring now to FIG. 8, the method by which the system 11 constructs the master caches is shown. Beginning in step 130, the processor 22 transposes each logic cell through the x-axis and temporarily stores the resulting logic cells in the memory means 18. In step 131, the processor 22 rotates each logic cell that resulted from the transposition in step 130 90 degrees and stores the resulting logic cells in the memory means 18. The processor 22 then, in step 132, transposes each logic cell described in the logic cell index through the y-axis and temporarily stores the resulting logic cells in the memory means 18. The processor 22 rotates, in step 133, each logic cell that resulted from the transposition in step 132 90 degrees and temporarily stores the resulting logic cells in the memory means 18. The processor 22 next, in step 134, rotates each logic cell described in the logic cell index 90 degrees and temporarily stores the resulting logic cells in the memory means 18. Similarly, the processor 22 next, in step 135, rotates each logic cell described in the logic cell index 180 degrees and temporarily stores the resulting logic cells in the memory means 18. Finally, the processor 22, in step 137, rotates each logic cell described in the logic cell index 270 degrees and temporarily stores the resulting logic cells in the memory means 18. Through the execution of these steps the processor 22 generates eight possible orientations of the logic cells. The processor 22 then, in step 136, compares the resulting logic cells to the logic cells that cannot be fabricated, which are described in the logic cell index memory 34, and eliminates all logic cells that match logic cells that cannot be fabricated. The processor 22 also, in step 136, eliminates all duplicate logic cells. In step 138, the processor 22 groups the logic cells according to the device that is located in the lower left hand corner of each logic cell. In step 140, the processor 22 combines logic cells within a group that are the same size and shape. The processor 22 also combines the interior wiring of the combined logic cells. The processor 22 uses a logical OR operation when combining the interior wiring of the logic cells. Thus, the resulting logic cell contains the interior wiring of the logic cells that were combined into it. After step 140, the resulting cells are master caches and the method ends.

Figure 9:
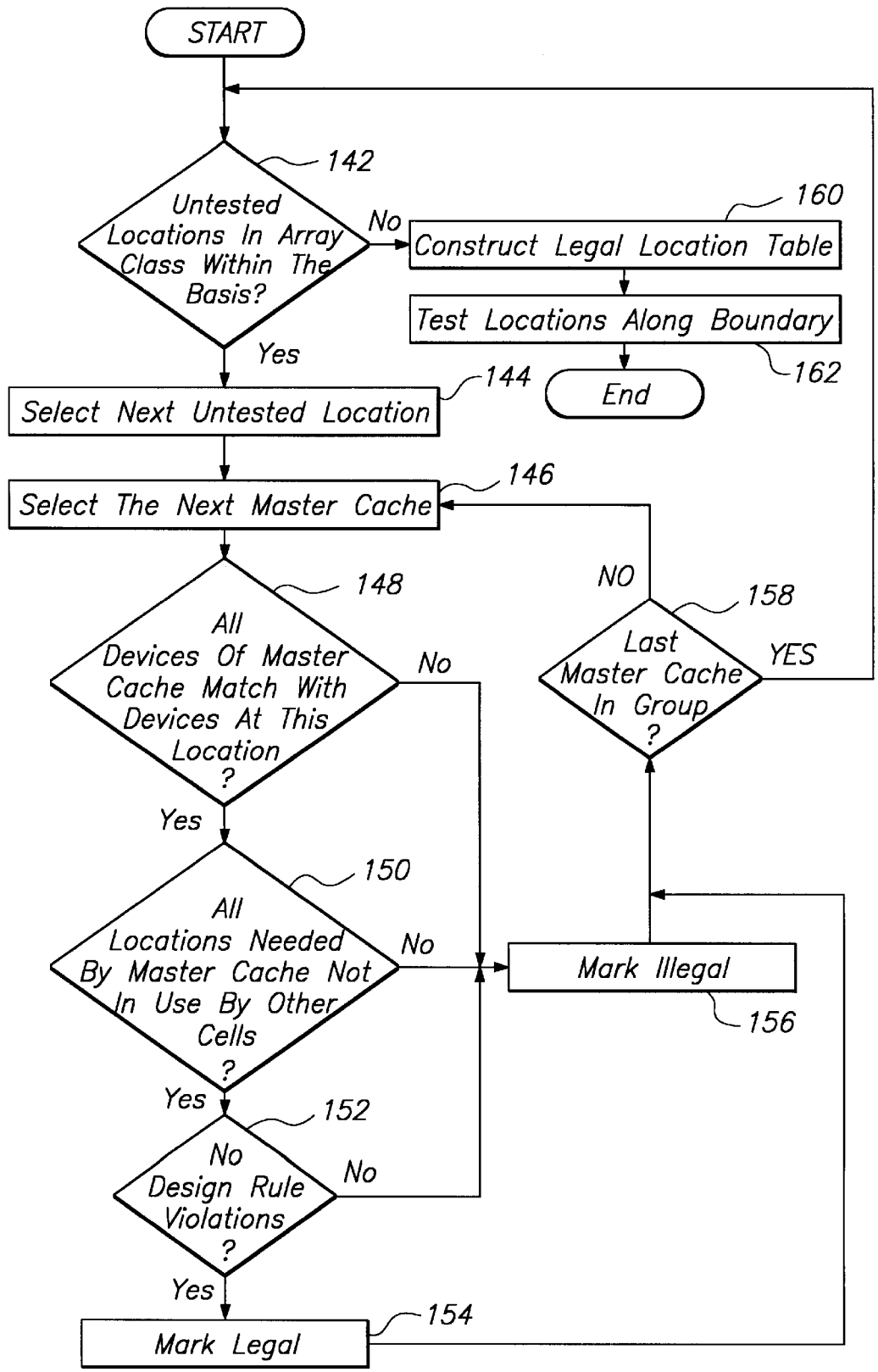
FIG. 9 is a flowchart showing the preferred method for testing for the legality of placing a master cache at a location on a base array.

Referring now to FIG. 9, the method of testing the locations of an array class for the legality of placing master caches at the locations of the array class is shown. An array class and the associated group of master caches are inputted. Beginning in step 142, the engine 54 determines if there are any untested locations for the array class within a basis. The engine 54 tests the locations of the array class that are within one basis. Since the base array is a repetition of the basis, the legal locations within a basis will be repeated across the base array. Thus, the system 11 only tests the locations of an array class within one basis. If the group of master caches associated with the array class includes a master cache larger than a basis or a master cache that crosses the boundary of the basis, the engine 54 repeats the basis until the multiple bases can accommodate the largest master cache. If in step 142, there are untested locations of the array class within a basis, the engine 54 proceeds to step 144. In step 144, the engine 54 selects the next untested location. The engine 54 then selects, in step 146, the next master cache from the group of master caches associated with the array class. The engine 54 now performs three tests on the master cache and the location. First, the engine 54 tests all the devices that make up the master cache against the devices of the locations that surround the location being tested. The engine 54 ensures that the surrounding locations match the devices of the master cache. Second, the engine 54 tests the surrounding locations for conflicts with adjacent pre-placed logic cells. Third, the engine 54 tests the location and master cache for design rule violations. The engine 54 creates a bit pattern for each location of the array class in the basis. The bit pattern contains a bit for each master cache of the group associated with the array class. If the master cache may be legally placed at a location, the engine 54 sets the bit, which corresponds to the master cache, high. If the master cache may not be legally placed at a location, the engine 54 sets the bit, which corresponds to the master cache, low. If a master cache may not be legally placed at a location, none of the logic cells that may have been combined to make up that master cache may be legally placed at that location.

In step 148, the engine 54 conducts the first test and tests the locations that surround the current location against the devices of the master cache. If the locations do not match, the engine 54 proceeds to step 156. If the devices do match, the engine 54 proceeds to step 150 and tests for conflicts with surrounding pre-placed logic cells. If there are conflicts, the engine 54 proceeds to step 156. If there are no conflicts, the engine 54 proceeds to step 152. In step 152, the engine 54 tests for design rule violations. If there are design rule violations, the engine 54 proceeds to step 156. If there are no design rule violations, the engine 54 proceeds to step 154 and marks the location legal for the master cache by setting the appropriate bit high. If the location and master cache failed any of the tests in steps 148, 150 or 152, the engine 54 marks the location illegal, in step 156, by setting the appropriate bit low. Once the engine 54 has executed either step 154 or step 156, the method proceeds to step 158. At step 158, the engine 54 searches the group of master caches for master caches that it has not yet tested at the current location and completes the bit pattern. If in step 158 there are untested master caches, the engine 54 returns to step 146 to test the next master cache at the current location and complete the bit pattern. If in step 158 there are no untested master caches, the engine 54 has completed testing this location and has formed a bit pattern for the location. The engine 54 temporarily stores the bit pattern in the memory means 18 and returns to step 142.

If there are no remaining untested locations of the array class within one basis in step 142, the engine 54 has completed testing this array class and proceeds to step 160 where it arranges the bit patterns that it created when testing the locations of the array class into the legal location table for the array class. The engine 54 next tests the locations of the array class that are along the upper boundary and along the right hand boundary of the array class. Referring also now to FIG. 5, a block diagram illustrating a high level view of an exemplary base array 25 is shown. Each box in FIG. 5 on the base array 25 represents a device. In this high level view of the exemplary base array 25 all devices are shown to be of identical size. As may be seen in FIG. 3A, the devices are, in actuality, not of identical size. The base array 25 contains a prior existing structure 42 which may be a pre-wire laid down by the manufacturer of the base array 24. The regions 40 along the upper and right hand boundaries of the base array 24, the regions 40 over the pre-existing structure 42, and the regions 40 surrounding the pre-existing structure 42 are highlighted in FIG. 5. The legality of placing a master cache in the region 40 around the boundaries and the pre-existing structures is different than for the rest of the base array. Therefore, the engine 54 tests locations within these region separately. The engine 54 first determines the extent of the regions that must be tested. The engine 54 selects a first master cache that is the largest, in the vertical dimension, of the master caches associated with the array class and selects a second master cache that is the largest, in the horizontal dimension, of the master caches associated with the array class. The first master cache and the second master cache may be the same master cache if it is the largest master cache in both the vertical dimension and the horizontal dimension. The engine 54 determines the height of the first master cache in terms of devices. The engine 54 then subtracts one from the height of the first master cache. The result is the number of rows of devices of the region along the upper boundary of the base array that must be tested. At this point, the system 11 only tests locations along the upper and right hand boundaries of the array class. Later, in step 110 of FIG. 6, the system 11 will test the locations occupied by and surrounding any pre-existing structure. When, in step 110 of FIG. 6, the engine 54 determines the region around a pre-existing structure that must be tested, it uses the method described here to determine the region above and below the pre-existing structure that must be tested. The engine 54 tests all locations of the array classes that fall within the extents of the region. In the same way, the engine 54 determines the width of the second master cache. The engine 54 subtracts one from the width of the widest master cache. The result is the number of columns of devices along the right boundary of the base array that must be tested. Similarly, the system 11 uses this method, in step 110 of FIG. 6 to determine the region to the right and to the left of the pre-existing structure that must be tested.

In step 162, the engine 54 determines the regions along the upper and right hand boundaries that must be tested and then tests the locations of the array class that are within these regions. The steps for testing and constructing bit patterns for locations in these regions is the same as described above with reference to steps 144–148. Except that in step 162, the engine 54 need not test for conflicts with pre-placed logic cells. The engine 54 adds the bit patterns for locations in the array class and within these regions to the legal location table memory 50. The method of constructing the legal location table for an array class is now complete. The method by which the engine 54 tested the region along the boundaries and added bit patterns to the legal location table is the same method the engine 54 used in step 110 of FIG. 6 for the region occupied and surrounding a pre-existing structure.

Figure 12:
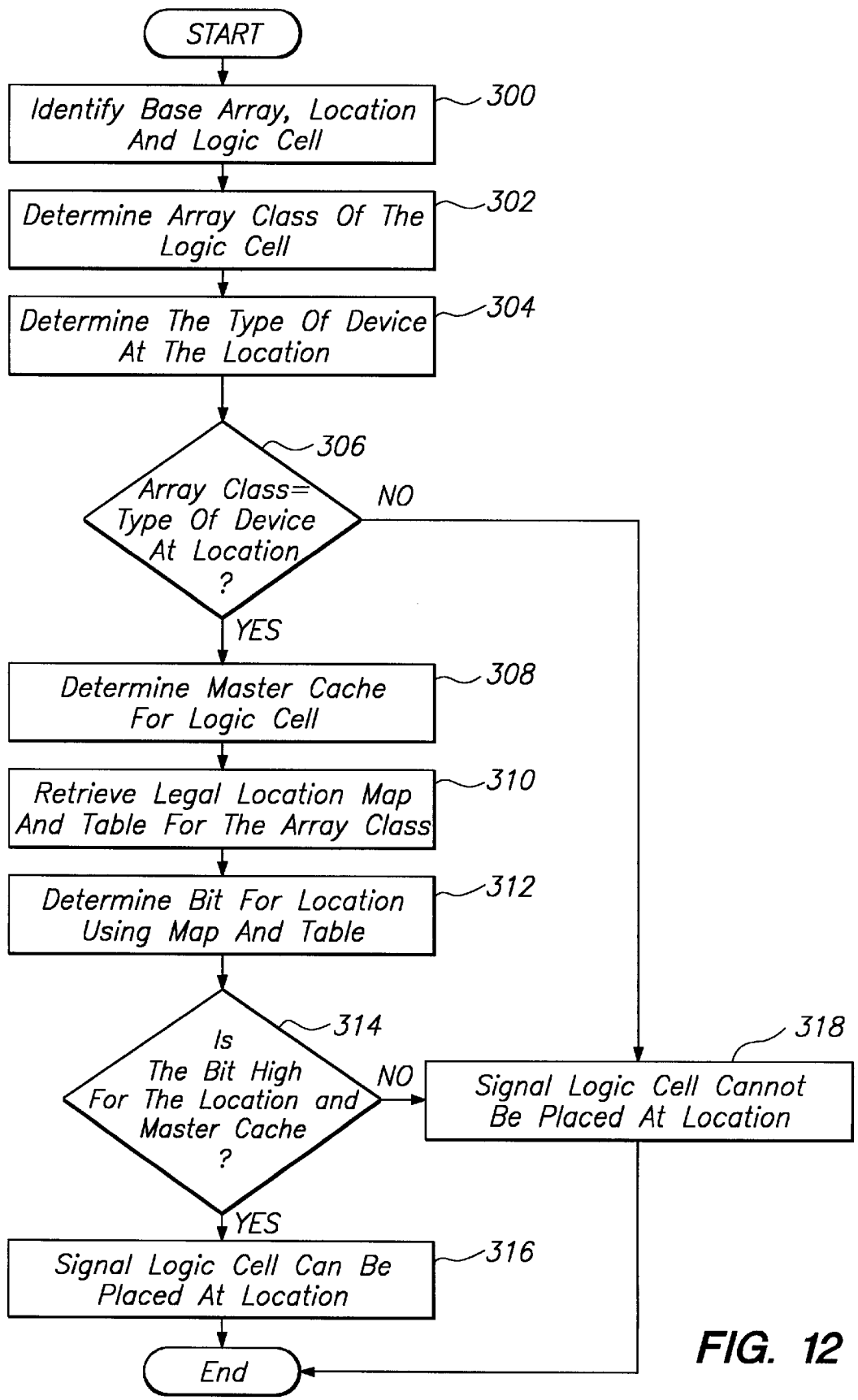
FIG. 12 is a flow chart of the preferred method for determining whether a logic cell can be placed at a location on a base array.

Referring now to FIG. 12, a flow chart of the preferred method for using the legal location maps and legal locations tables for testing whether a logic cell may be placed at a particular location on a base array is shown. The preferred method of testing begins in step 300. In step 300, the method identifies the base array, the location where the logic cell is to be placed and the logic cell to be placed. The base array, location and logic cell may be input to the system by another system performing cell layout for example. Next in step 302, the array class of the logic cell to be place is determined. This is done by identifying the type of the device in the lower left-hand corner of the logic cell. Next in step 304, the method determines the type of device that is positioned at the location of the base array input and identified in step 300. Then in step 306, the method compares the array class of the logic cell to the type of device at the location of the base array input, and determines if they are the same. In order for the logic cell to be placed the device of the array class must match the location input. If it is determined in step 306 that the there is not a match, the method proceeds to step 318 where the system signals that the logic cell cannot be legally placed at the location specified and the method is complete.

However, if it is determined in step 306 that there is a match, the method proceeds to step 308, where the method determines the master cache that corresponds to the logic cell. This determination is made by comparing the input logic cell to the group of master caches associated with the array class found in step 302. One of the master caches is made up of the same configuration and orientation of base array devices that form the logic cell. Next in step 310, the method retrieves the legal location map and the legal location table corresponding to the array class identified in step 302. Then in step 312, the method determines a bit that indicates whether the master cache or logic cell may be legally placed at the location. Determination of the bit is accomplished by first identifying the location in the legal location map that corresponds to the input location's position in array class. Second, the method determines the reference number stored at the corresponding location of the legal location map and retrieves the reference number. Third, the method uses the retrieved reference number to find a bit pattern in the legal location table. Fourth and finally, the method extracts a bit from the bit pattern that has a position in the bit pattern that corresponds to the master cache determined in step 308. This bit indicates whether the input logic cell can legally be placed at the input location.

Next in step 314, the method tests whether the bit has a high value. If the bit has a high value, then the input logic cell can legally be placed at the input location, and the method continues in step 316 by signaling that the logic cell can be placed. Once the signal has been issued, method is complete and ends. If the bit does not have a high value, then the input logic cell cannot legally be placed at the input location, and the method continues to step 318 where this is signaled and the method ends.

Figure 10B:
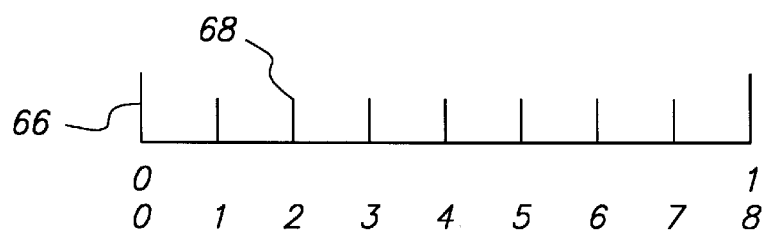
FIG. 10B is a block diagram of an enlargement of a step of the hashing array shown in FIG. 10A.
Figure 10A:
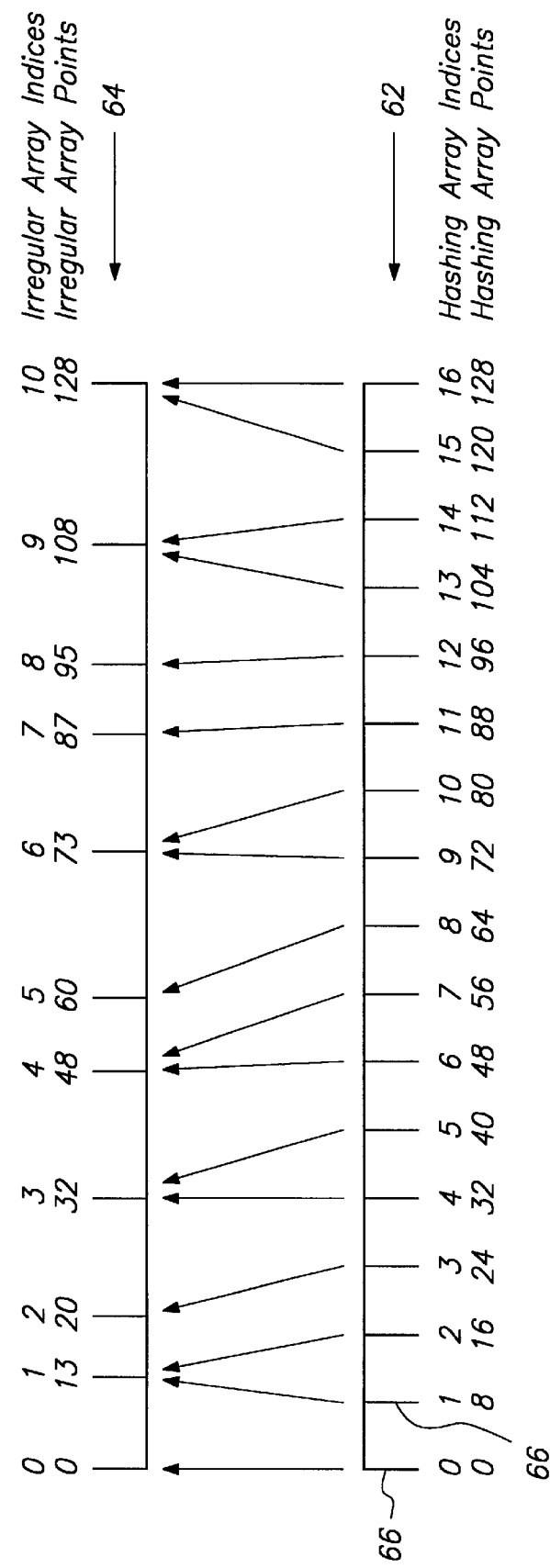
FIG. 10A is a block diagram of an exemplary hashing array and an exemplary irregular array.

Referring now to FIGS. 10A & 10B, a block diagram of an exemplary hashing array is shown. FIG. 10A includes a hashing array 62, an irregular array 64, and a plurality of steps 66 of the hashing array 62. An irregular array may represent a coordinate axis of a base array. The devices on the base array are of different sizes. Therefore, the step size of the coordinate axes that describe the base array will be irregular. Each point that designates a device on the irregular array has a corresponding index. Thus, the index on the irregular array that corresponds to hashing array point 32 is index 3. The hashing array 62 is a regular coordinate axis. There is a correspondence between the steps, or indices, of the hashing array 62 and the indices of the irregular array 64. Each step of the hashing array 62 corresponds to one point on the irregular array 64. When given a step on the hashing array 62, finding the point on the irregular array 64 is simply a matter of looking up the correspondence from a hashing table stored in the hashing array memory 36. The indices of the hashing array 62 are preferably sub-divided into gradients. FIG. 10B shows an enlargement of an index 66 of the hashing array 62. Each index 66 comprises a plurality of gradients 68. Preferably the number of gradients 68 in each index 66 is a power of two. In the exemplary index 66, there are eight or $2^3$ gradients 68. The power of two is referred to as K. In the exemplary index 66, K equals 3. Indices on the irregular array 64 are stated in gradients. Thus, the first step on the irregular array 64 is 13 gradients from the origin of the irregular array 64. The hashing array 62 is stored in the hashing array memory 36.

Figure 11:
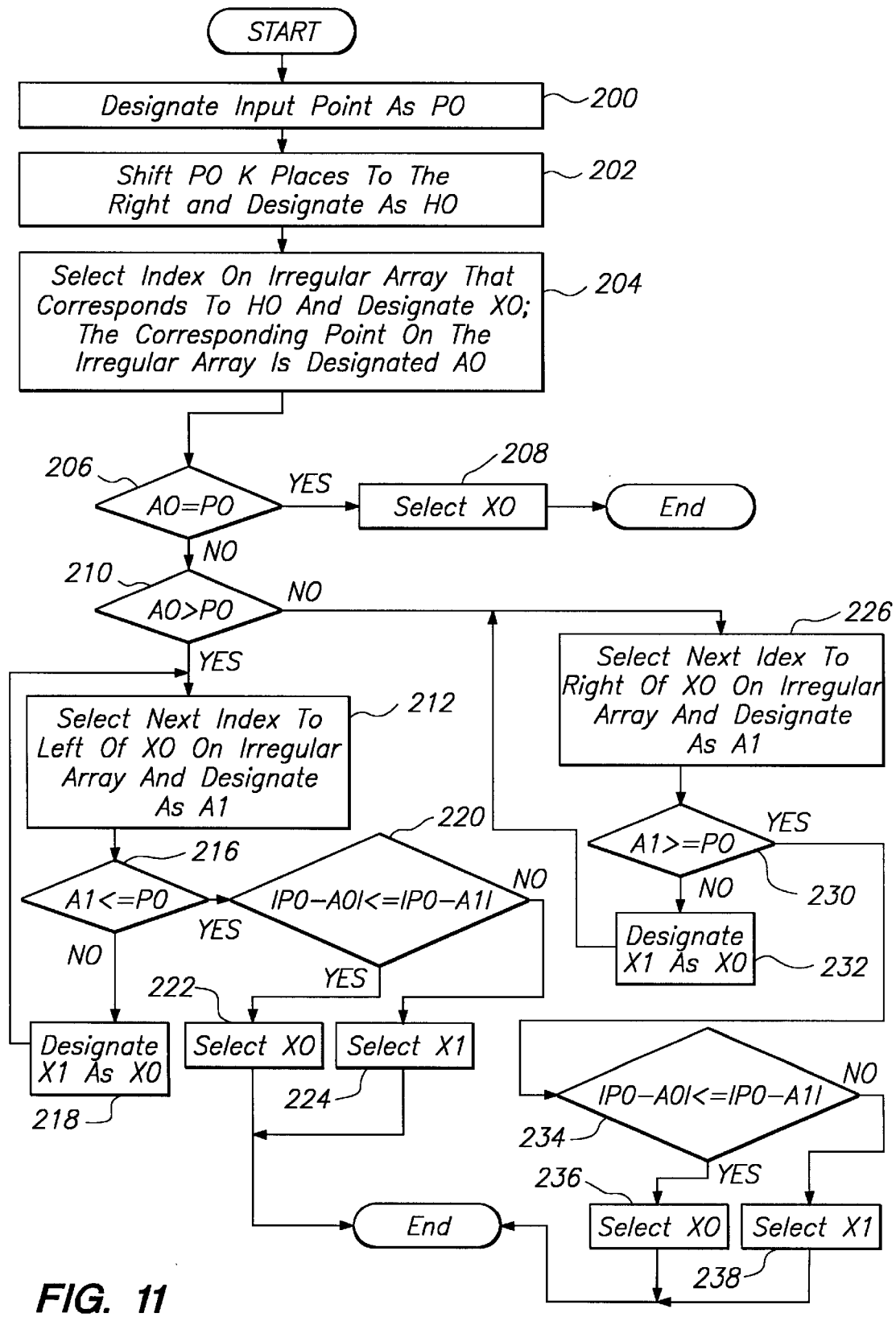
FIG. 11 is a flow chart showing the preferred method of using a hashing array to located points on an irregular array.

Referring now to FIG. 11, the preferred method of finding indices on the irregular array 64 using the hashing array 62 of the present invention is shown. The preferred method uses the hashing array 62 to find efficiently the closest irregular array index for a given location. The hashing array memory 36 also stores program instruction steps that when executed by the processor 22 carry out this method. There is a correspondence between the hashing array 62 and the irregular array 64. Finding locations when the hashing array index 66 is known is simply a matter of looking up the correspondence. FIG. 11 shows a preferred method of finding the hashing index 66 for a given point on the irregular array 64.

Beginning in step 200, a point on the irregular array 64 is input to the method. The processor 22 designates this point P0. Also input in step 200 is the power of two, or K, of the number of gradients 68 within an index 66 of the hashing array 62. In FIG. 10B, where the number of gradients 68 within an index 66 is 8, K is 3. In step 202, the processor 22 shifts the binary expression of P0 K places to the right. If the point on the irregular array 64 is 14, its binary expression is 1110. Three shifts to the right results in 1. The resulting number indicates an index 66 on the hashing array 62; the processor 22 designates this index H0. In the example, the index 66 is index 1. In step 204, the processor 22 selects the index on the irregular array 64 that corresponds to H0, designates this index X0, and designates, the point that corresponds to index X0, on the irregular array 64, A0. The goal is to find the index on the irregular array 64 whose corresponding point is closest to the input point. On the exemplary irregularly array 64 of FIG. 10A, X0 is 1 and A0 is 13.

In step 206, the processor 22 determines if A0=P0. If the points are equal, the processor 22 selects, in step 208, X0 as the index 66 on the irregular array 64, and the method ends. If the points are not equal, the processor 22 determines if A0 is above or below P0. In the example, P0 is greater than A0. Thus, in step 210, the processor 22 determines if A0 is greater than P0. If A0 is less than P0, the method continues in step 226. If A0 is greater than P0, the method continues in step 212. The processor 22 must now bracket P0. In step 212, the processor 22 selects the next index to the left of X0 on the irregular array 64 and designates this index X1 (X1=X0−1 Index). Next, in step 216, the processor 22 determines if A1 is less than or equal to P0. The processor 22 must bracket P0. If A1 is not less than or equal to P0, the processor 22, in step 218, designates X1 as X0 and returns to step 212. In this way, the processor 22 moves to the left, down the irregular array 64, until it finds two indices on the irregular array 64 whose corresponding points on the irregular array 64 bracket P0. If in step 216, A1 is less than or equal to P0, the processor 22 has bracketed P0. That is A0 is above P0, and A1 is below P0. The processor 22 must select the index on the irregular array 64 whose corresponding point on the irregular array 64 is closest to P0. In step 220, the processor 22 determines if the distance from P0 to A0 is less than the distance from P0 to A1. If the distance from P0 to A0 is less than the distance from P0 to A1, the processor 22 selects X0, and the method ends. If the distance from P0 to A0 is not less than the distance from P0 to A1, the processor 22 selects index X1, and the method ends.

If, in step 210, A0 is less than P0, the system 11 uses a similar method. In this case, A0 is below P0; therefore, the processor 22 must move up the irregular array 64 to bracket P0. In step 226, the processor 22 selects the next step to the right of X0 and designates this index X1 (X1=X0+1 Index). Next, in step 228, the processor 22 selects the point on the irregular array 64 that corresponds to X1 and designates the point A1. The processor 22 determines, in step 230, if A1 is above or equal to P0. If A1 is not above or equal to P0, the processor 22, in step 232, designates X1 as X0 and returns to step 226. If A1 is above or equal to P0, the processor 22 has bracketed P0. In step 234, the processor 22 determines if the distance from P0 to A0 is less than or equal to the distance from P0 to A1. If A0 is closer to P0, the processor 22 selects X0 in step 236, and the method ends. If A1 is closer to P0, the processor 22 selects X1 in step 238, and the method ends.

To continue the example, P0 (14) is greater than A0 (13). Therefore, the processor 22 selects index 2 on the irregular array 64 and designates it as X1. The processor 22 then designates the point on the irregular array 64 that corresponds to X1 as A1. A1 (13) is less than P0 (14). The processor 22 designates X1 (2) as X0. The next index to the right of X0 (2) is 3; the processor 22 designates this index as X1. The point on the irregular array 64 that corresponds to X1 (3) is 20. The processor 22 designates this point as A1. A1 (20) is greater than P0 (14). The processor 22 has bracketed P0 (14). The distance from P0 (14) to A0 (13) is less than the distance from P0 (14) to A1 (20). Thus, the method selects X0 (1) as the index on the irregular array 64 that best describes the input point on the irregular array 64.

This method was described here for a coordinate axis of the base array such as the x-axis. Those skilled in the art will realize that the method is equally valid and is used for any axis of the base array including the y-axis. Thus, the hashing array 62 is used to form a regular x-y axis plane.

While the present invention has been described with reference to certain preferred embodiments, those skilled in the art will recognize that various modifications may be provided. For example, the floor plan may be sub-divided into categories other than by device or all master caches associated with an array class may be combined into the largest master cache associated with the array class. These and other variations upon and modifications to the preferred embodiments are provided for by the present invention, which is limited only by the following claims.

What is claimed is:

1. A method for testing placement of representations of physical implementations of a plurality of logic cells on a base array having a plurality of types of transistor-level devices, each of the transistor-level devices in a predetermined location on the base array, each representation of a physical implementation of a logic cell including at least one transistor-level device, the method comprising the steps of:

identifying a first type of transistor-level device on the base array corresponding to a predetermined position in a representation of a physical implementation of a first logic cell;

identifying a group of transistor-level representations of physical implementations of logic cells wherein said first type of transistor-level device is in a predetermined position in each representation of a physical implementation of a logic cell in said group;

building an array class comprising a group of locations disposed on the base array, each location in the array class having said first type of transistor-level device in the predetermined position in each representation of a physical implementation of a logic cell of the identified group;

determining whether a transistor-level representation of a physical implementation of a logic cell in the identified group of transistor-level representations of physical implementations of logic cells can be placed at a location in the array class; and constructing a bit pattern for each location in the array class, each bit pattern indicating the representations of physical implementations of logic cells that can be placed at the location in the array class.

2. The method of claim 1, wherein the steps of identifying a first type of transistor-level device, identifying a group, building, determining, and constructing are repeated for each type of transistor-level device on the base array.

3. The method of claim 1, wherein the step of determining is performed for each transistor-level representation of a physical implementation of a logic cell in the identified group for locations in a basis of the base array; and wherein the step of constructing is performed for each transistor-level representation of a physical implementation of a logic cell in the identified group for the locations in the basis of the base array.

4. The method of claim 1, wherein the steps of determining and constructing are executed for the locations within a predetermined distance of the boundaries of the base array.

5. The method of claim 1, wherein the steps of determining and constructing are executed for the locations occupied by a pre-existing structure on the base array, and for locations within a predetermined distance of the pre-existing structure on the base array.

6. The method of claim 1, wherein the step of identifying a group of transistor-level representations of physical implementations of logic cells comprises the steps of:

generating possible orientations of each transistor-level representation of a physical implementation of a logic cell;

separating a group of transistor-level representations of physical implementations of logic cells, from said possible orientations of each said transistor-level representation of a physical implementation of a logic cell, wherein each transistor-level representation of a physical implementation of a logic cell in this group has the same type of transistor-level device in the pre-determined position; and combining the transistor-level representations of physical implementations of logic cells within the separated group that are the same size and shape to produce a master cache.

7. The method of claim 6, wherein the pre-determined position is the lower, left position of a transistor-level representation of a physical implementation of a logic cell.

8. The method of claim 6, wherein when transistor-level representations of physical implementations of logic cells within a group are combined, representations of physical implementations of internal wiring of said transistor-level representations of physical implementations of logic cells is combined in the master cache.

9. The method of claim 1, wherein the step of determining whether a transistor-level representation of a physical implementation of a logic cell in the identified group of transistor-level representations of physical implementations of logic cells can be placed at a location in the array class includes at least one of the following steps:

determining if the transistor-level devices that surround the location match the transistor-level devices of said transistor-level representation of a physical implementation of the logic cell;

comparing the transistor-level devices that surround the location with the transistor-level devices in said transistor-level representation of a physical implementation of the logic cell to determine if the transistor-level devices that surround the location are available for use by said representation of a physical implementation of the logic cell; and determining if placing said transistor-level representation of a physical implementation of the logic cell at the location violates a design rule.

10. The method of claim 6, wherein the step of generating possible orientations of a transistor-level representation of a physical implementation of a logic cell comprises the step of transposing the transistor-level representation of a physical implementation of the logic cell through its x-axis.

11. The method of claim 6, wherein the step of generating possible orientations of a transistor-level representation of a physical implementation of a logic cell comprises the step of transposing the transistor-level representation of a physical implementation of the logic cell through its y-axis.

12. The method of claim 6, wherein the step of generating possible orientations of a transistor-level representation of a physical implementation of a logic cell comprises the step of transposing the transistor-level representation of a physical implementation of the logic cell through its x-axis and its y-axis.

13. The method of claim 6, wherein the step of generating possible orientations of a transistor-level representation of a physical implementation of a logic cell comprises the step of rotating the transistor-level representation of a physical implementation of the logic cell 180 degrees.

14. The method of claim 6, wherein the step of generating possible orientations of a transistor-level representation of a physical implementation of a logic cell comprises the step of rotating the transistor-level representation of a physical implementation of the logic cell 270 degrees.

15. The method of claim 1, further comprising the steps of:

eliminating duplicate bit patterns; and constructing a table of the remaining, unique bit patterns.

16. The method of claim 15, further comprising the step of constructing a legal location index map of the array class including, for each location in the array class, a reference to a bit pattern in the table of unique bit patterns that identifies the transistor-level representation of a physical implementation of logic cells that can be placed at that location.

17. The method of claim 16, further comprising the steps of:

determining a region along a boundary of the base array;

determining if the transistor-level representations of physical implementations of logic cells of the identified group may be placed at the locations of the array class within the region;

adding bit patterns to the table of unique bit patterns for the locations of the array class within the region; and altering the legal location index map for each location in the region to store the bit pattern that identifies the transistor-level representations of physical implementations of logic cells that can be placed at each respective location in the region.

18. The method of claim 17, wherein the step of determining the region along the boundary of the base array comprises the steps of:

selecting a first transistor-level representation of a physical implementation of a logic cell from the identified group of transistor-level representations of physical implementations of logic cells that is the largest transistor-level representation of a physical implementation of a logic cell in a vertical dimension;

determining a size of the first transistor-level representation of a physical implementation of a logic cell in the vertical dimension in terms of transistor-level devices;

subtracting one transistor-level device from the size of the first transistor-level representation of a physical implementation of a logic cell in the vertical dimension;

identifying rows of locations along an upper boundary of the base array wherein the number of rows is equal to the result of the subtracting step;

selecting a second transistor-level representation of a physical implementation of a logic cell from the group of representations of physical implementations of logic cells that is the largest transistor-level representation of a physical implementation of a logic cell in a horizontal dimension;

determining the size in the horizontal dimension of the second transistor-level representation of a physical implementation of a logic cell in terms of transistor-level devices;

subtracting one transistor-level from the size of the second transistor-level representation of a physical implementation of a logic cell in the horizontal dimension; and identifying the columns of locations along a right boundary of the base array wherein the number of columns is equal to the result of the second subtracting step.

19. The method of claim 16, further comprising the steps of:

determining a region surrounding and occupied by a pre-existing structure on the base array;

determining the transistor-level representations of physical implementations of logic cells of the identified group that can be placed at the locations of the array class within the region;

adding bit patterns to the table, the bit patterns identifying the transistor-level representations of physical implementations of logic cells that can be placed at each location in the region; and altering the map for each location in the region with the bit patterns that specify the transistor-level representations of physical implementations of logic cells that can be placed at the respective location in the region.

20. The method of claim 19, wherein the step of determining a region surrounding a pre-existing structure on the base array comprises the steps of:

identifying locations of the base array over the pre-existing structure;

selecting a first transistor-level representation of a physical implementation of a logic cell from the group of transistor-level representations of physical implementations of logic cells that is the largest transistor-level representation of a physical implementation of a logic cell in a vertical dimension;

determining the size in the vertical dimension of the first transistor-level representation of a physical implementation of a logic cell in terms of transistor-level devices;

first reducing the size of the first transistor-level representation of a physical implementation of a logic cell by one transistor-level device;

identifying rows of locations above and below the pre-existing structure on the base array wherein the number of rows is equal to the result of first reducing step in the vertical dimension;

selecting a second transistor-level representation of a physical implementation of a logic cell from the group of representations of physical implementations of logic cells that is the largest transistor-level representation of a physical implementation of a logic cell in a horizontal dimension;

determining a horizontal size of the second transistor-level representation of a physical implementation of a logic cell in terms of transistor-level devices;

second reducing the horizontal size of the second transistor-level representation of a physical implementation of a logic cell by one; and identifying the columns of locations along left and right sides of the pre-existing structure on the base array wherein the number of columns is equal to the second reducing step in the horizontal dimension.

21. A method for determining the legality of placing a transistor-level representation of a physical implementation of a logic cell at a location on a base array, the base array having a plurality of types of transistor-level devices, each of the transistor-level devices in a predetermined location on the base array, the method comprising the steps of:

identifying an input base array, an input location on the input base array, and a transistor-level representation of a physical implementation of an input logic cell;

determining an array class with a transistor-level device type corresponding to the input logic cell;

determining a type of transistor-level device at the input location;

determining if the type of transistor-level device at the identified location matches the transistor-level device type for the array class;

signaling that the input logic cell cannot be placed at the location if the type of transistor-level device at the identified location does not match the transistor-level device type for the array class; and if the type of transistor-level device at the identified location matches the transistor-level device type for the array class performing the steps of:

determining a master cache to which the input logic cell corresponds;

retrieving a location table and a location map for the array class;

determining the bit pattern for the location using the location map and the location table and extracting a bit identifying whether the input logic cell can be placed at the input location;

determining if the extracted bit is high;

signaling that the input logic cell cannot be placed at the location if the bit is not high; and signaling that the input logic cell can be placed at the location if the bit is high.

22. An apparatus for creating a location table and location map for use in testing the placement of representations of physical implementations of logic cells on a base array of transistor-level devices, the apparatus comprising:

a base array memory, having inputs and outputs, for storing a record of a base array, said base array having a plurality of transistor-level devices;

a logic cell index memory, having inputs and outputs coupled to the base array memory, for storing transistor-level representations of physical implementations of a plurality of logic cells, each logic cell of said plurality comprising at least one of said transistor-level devices; and an engine means, having inputs and outputs coupled to the base array memory and the logic cell index memory, for comparing said transistor-level devices in said base array with said at least one transistor-level device of each logic cell to test the placement of transistor-level representations of physical implementations of logic cells on the base array, and for generating a table of unique bit patterns specifying the legality of placing said transistor-level representations of physical implementations of logic cells at a plurality of locations on the base array, and for generating a location index map including for each of a plurality of locations on the base array a reference to the bit pattern in the legal location table that indicates the locations on the base array at which the transistor-level representations of physical implementations of logic cells can be placed.

23. The apparatus of claim 22, further comprising:

a basis memory, having inputs and outputs coupled to the base array memory, the logic cell index memory, and the engine means, for storing a record of a basis of the base array;

a floor plan memory, having inputs and outputs coupled to the base array memory, the logic cell index memory, the engine means, and the basis memory, for storing a floor plan of the base array; and an array class means, having inputs and outputs coupled to the base array memory, the logic cell index memory, the engine means, the basis memory and the floor plan memory, for generating from the floor plan stored in the floor plan memory an array class and for storing at least one array class.

24. The apparatus of claim 22, further comprising a master cache means, having inputs and outputs coupled to the base array memory, the logic cell index memory and the engine means for manipulating the representations of physical implementations of logic cells stored in the logic cell index memory to generate at least one master cache from the representations of physical implementations of logic cells stored in the logic cell index memory, and for storing each master cache generated.

25. The apparatus of claim 22 further comprising:

a legal location table memory, having inputs and outputs coupled to the base array memory, the logic cell index memory, the engine means and the master cache means for storing at least one legal location table generated by the engine means; and a legal location index map memory, having inputs and outputs coupled to the base array memory, the logic cell index memory, the engine means, the master cache means, and the legal location table memory, for storing at least one legal location index map generated by the engine means.

26. A method for testing placement of a plurality of representations of physical implementations of logic cells on a base array having a plurality of types of transistor-level devices, each of the transistor-level devices in a pre-determined location on the base array, each representation of a physical implementation of a logic cell including at least one transistor-level device, the method comprising the steps of:

identifying a group of transistor-level representations of physical implementations of logic cells having a type of transistor-level device in a pre-determined position in each transistor-level representation of a physical implementation of a logic cell in the identified group, including the steps of:

generating possible orientations of each transistor-level representation of a physical implementation of a logic cell;

separating a group of transistor-level representations of physical implementations of logic cells, from said possible orientations of each of said transistor-level representations of physical implementations of logic cells, wherein each representation of a physical implementation of a logic cell in this group has said type of transistor-level device in the pre-determined position; and combining the transistor-level representations of physical implementations of logic cells within the group that are the same size and shape to produce a master cache;

building an array class of locations on the base array having said type of transistor-level device in the pre-determined position;

determining whether a selected transistor-level representation of a physical implementation of a logic cell of the identified group of representations of physical implementations of logic cells can be placed at a location in the array class including at least one of the following set of steps:

determining if the transistor-level devices that surround the location match the transistor-level devices of the selected transistor-level representation of a physical implementation of a logic cell;

determining if the transistor-level devices that surround the location are available for use by the selected transistor level representation of a physical implementation of a logic cell; and determining if placing the selected transistor-level representation of a physical implementation of a logic cell at the location violates a design rule; and constructing a bit pattern for each location in the array class, each bit pattern indicating the transistor-level representations of physical implementations of logic cells that can be placed at the location in the array class.

27. The method of claim 26, wherein the step of determining is performed for each transistor-level representation of a physical implementation of a logic cell in the identified group for locations in a basis of the base array; and wherein the step of constructing is performed for each transistor-level representation of a physical implementation of a logic cell in the identified group for the locations in the basis of the base array.

28. The method of claim 27, further comprising the steps of:

eliminating duplicate bit patterns; and constructing a table of the remaining, unique bit patterns.

29. The method of claim 28 further comprising the step of constructing a legal location index map of the array class including, for each location in the array class, a reference to a bit pattern in the table of unique bit patterns that identifies the transistor-level representations of physical implementations of logic cells that can be placed at that location.

30. The method of claim 29, further comprising the steps of:

determining a region along a boundary of the base array;

determining transistor-level representations of physical implementations of logic cells of the identified group that can be placed at the locations of the array class within the region;

adding bit patterns to the table of unique bit patterns for the locations of the array class within the region; and altering the legal location index map for each location in the region to store the bit pattern that identifies the transistor-level representations of physical implementations of logic cells that can be placed at each respective location in the region.

31. The method of claim 30, wherein the step of determining the region along the boundary of the base array comprises the steps of:

selecting a first transistor-level representation of a physical implementation of a logic cell from the identified group of transistor-level representations of physical implementations of logic cells that is the largest transistor-level representation of a physical implementation of a logic cell in a vertical dimension;

determining a size of the first transistor-level representation of a physical implementation of a logic cell in the vertical dimension in terms of transistor-level devices;

subtracting one transistor-level device from the size of the first transistor-level representation of a physical implementation of a logic cell in the vertical dimension;

identifying rows of locations along an upper boundary of the base array wherein the number of rows is equal to the result of the subtracting step;

selecting a second transistor-level representation of a physical implementation of a logic cell from the group of transistor-level representations of physical implementations of logic cells that is the largest transistor-level representation of a physical implementation of a logic cell in a horizontal dimension;

determining the size in the horizontal dimension of the second transistor-level representation of a physical implementation of a logic cell in terms of transistor-level devices;

subtracting one transistor-level device from the size of the second transistor-level representation of a physical implementation of a logic cell in the horizontal dimension; and identifying the columns of locations along a right boundary of the base array wherein the number of columns is equal to the result of the second subtracting step.

32. The method of claim 31, further comprising the steps of:

determining a region surrounding and occupied by a pre-existing structure on the base array;

determining the transistor-level representations of physical implementations of logic cells of the identified group that can be placed at the locations of the array class within the region;

adding bit patterns to the table, the bit patterns identifying the transistor-level representations of physical implementations of logic cells that can be placed at each location in the region; and altering the map for each location in the region with the bit patterns that specify the transistor-level representations of physical implementations of logic cells that can be placed at the respective location in the region.

33. The method of claim 32, wherein the step of determining a region surrounding a pre-existing structure on the base array comprises the steps of:

identifying locations of the base array over the pre-existing structure;

selecting a first transistor-level representation of a physical implementation of a logic cell from the group of transistor-level representations of physical implementations of logic cells that is the largest transistor-level representation of a physical implementation of a logic cell in a vertical dimension;

determining the size in the vertical dimension of the first transistor-level representation of a physical implementation of a logic cell in terms of transistor-level devices;

first reducing the size of the first transistor-level representation of a physical implementation of a logic cell by one transistor-level device;

identifying rows of locations above and below the pre-existing structure on the base array wherein the number of rows is equal to the result of first reducing step in the vertical dimension;

selecting a second transistor-level representation of a physical implementation of a logic cell from the group of transistor-level representations of physical implementations of logic cells that is the largest transistor-level representation of a physical implementation of a logic cell in a horizontal dimension;

determining a horizontal size of the second transistor-level representation of a physical implementation of a logic cell in terms of transistor-level devices;

second reducing the horizontal size of the second transistor-level representation of a physical implementation of a logic cell by one; and identifying the columns of locations along left and right sides of the pre-existing structure on the base array wherein the number of columns is equal to the second reducing step in the horizontal dimension.

34. The method of claim 26, wherein each transistor-level device is not automatically identified with one of said logic cells.

35. The method of claim 1, wherein each transistor-level device is not automatically identified with one of said logic cells.

36. The method of claim 21, wherein each transistor-level device is not automatically identified with one of said logic cells.

37. The apparatus of claim 22, wherein each transistor-level device is not automatically identified with one of said logic cells.

* * * * *